United States Patent
Zhang

(10) Patent No.: US 7,185,294 B2
(45) Date of Patent: Feb. 27, 2007

(54) STANDARD CELL LIBRARY HAVING GLOBALLY SCALABLE TRANSISTOR CHANNEL LENGTH

(75) Inventor: Xiaonan Zhang, Palo Alto, CA (US)

(73) Assignee: VeriSilicon Holdings, Co Ltd, Santa Clara, CA (US)

( * ) Notice: Subject to any disclaimer, the term of this patent is extended or adjusted under 35 U.S.C. 154(b) by 212 days.

(21) Appl. No.: 10/949,878

(22) Filed: Sep. 23, 2004

(65) Prior Publication Data

US 2006/0064665 A1 Mar. 23, 2006

(51) Int. Cl.
*G06F 17/50* (2006.01)

(52) U.S. Cl. .......................... 716/2; 716/10

(58) Field of Classification Search ............... 716/2, 716/10
See application file for complete search history.

(56) References Cited

U.S. PATENT DOCUMENTS

| | | | |
|---|---|---|---|
| 5,598,347 A | 1/1997 | Iwasaki | 364/491 |
| 5,619,420 A | 4/1997 | Breid | 364/491 |
| 5,663,662 A | 9/1997 | Kurosawa | 326/41 |
| 5,872,717 A | 2/1999 | Yu et al. | 364/489 |
| 5,880,967 A | 3/1999 | Jyu et al. | 364/489 |
| 6,336,207 B2 | 1/2002 | Shinomiya et al. | 716/11 |
| 6,425,115 B1 | 7/2002 | Risler et al. | 716/17 |
| 6,427,226 B1 | 7/2002 | Mallick et al. | 716/10 |
| 6,467,068 B1 | 10/2002 | Iyer et al. | 716/6 |
| 6,536,028 B1 | 3/2003 | Katsioulas et al. | 716/17 |
| 6,769,110 B2 | 7/2004 | Katoh et al. | 716/17 |
| 2004/0237061 A1* | 11/2004 | Kahng et al. | 716/19 |

* cited by examiner

*Primary Examiner*—Stacy A Whitmore
(74) *Attorney, Agent, or Firm*—Lumen Intellectual Property Services Inc.

(57) ABSTRACT

A standard cell library having a globally scalable transistor channel length is provided. In this library, the channel length of every transistor within a cell can be globally scaled, within a predetermined range, without changing cell functionality, cell size, or cell terminal positions. Such a cell library advantageously addresses the intra-generational redesign problem, since cell channel lengths in library cells can be decreased as fabrication technology evolves, without requiring intra-generational redesign of existing circuit layouts. Preferably, this change in channel length is obtained by altering a single mask layer of the library design (e.g., the mask for the poly-silicon layer).

8 Claims, 3 Drawing Sheets

US 7,185,294 B2

STANDARD CELL LIBRARY HAVING GLOBALLY SCALABLE TRANSISTOR CHANNEL LENGTH

FIELD OF THE INVENTION

This invention relates to standard cell libraries for integrated circuit design.

BACKGROUND

Standard cell libraries are commonly employed for integrated circuit design. In this design approach, circuit functions (such functions include logic gates such as AND and OR gates, as well as sequential logic elements such as flip flops) each have a corresponding library cell type. Each cell type corresponds to one or more library cells. Library cells include a detailed device-level layout for providing the corresponding circuit function. For example, a cell type can be AND2 (a 2 input AND gate). Several different AND2 cells can be included in a typical cell library (e.g., having different drive strengths and/or different threshold voltages). Circuit design with a cell library typically relies on automated selection of cells from the library to perform the required circuit functions. In this manner, a detailed layout design is automatically obtained from a functional circuit design.

The design of cell libraries tends to be driven by minimization of cell physical area subject to other design constraints (e.g., on drive strength and/or threshold voltage) and subject to a minimum feature size constraint. The minimum feature size constraint (also known as the design rule distance) is a key consideration in integrated circuit design. In the context of commercial integrated circuit fabrication, the minimum feature size L is usually defined operationally. More specifically, a fabrication vendor will usually agree to meet performance specifications only if the minimum feature size in the circuit layout provided to the vendor is greater than or equal to L. Thus L can vary from vendor to vendor at a given time, and generally tends to decrease over time as fabrication technology advances. For state of the art fabrication facilities, L is presently well under 0.25 μm, and is expected to significantly decrease in the future.

Cell libraries can also be classified in terms of a minimum distance. Thus a 0.25 μm cell library is a cell library in which all cells have a minimum feature size no less than 0.25 μm. Such a cell library can be used to provide layout designs for any fabrication facility providing an L of 0.25 μm or less. Typically, all cells in a library are designed according to the same design rules (e.g., 0.25 μm design rules). Typically, L as provided by fabrication vendors decreases in a stepwise manner, and each L in the sequence is often referred to as a generation. For example, in Silicon the fabrication generations are 0.25 μm, 0.18 μm, 0.13 μm, 90 nm, and 65 nm. Future decreases in L are also expected to follow this generational pattern. Conventional cell libraries follow the same generational pattern.

However, in practice fabrication capability improves continuously. A significant effect of this continuous improvement is a generally decreasing process variability over time within a generation. When a new generation is first introduced, the process variability is largest, and then decreases over time. This behavior poses a difficult problem to the circuit designer, since the transition to a new generation tends to be accompanied by an increase in process variability. This increase in process variability tends to decrease yield (e.g., by increasing leakage). In some cases, this decrease in yield is significant enough to complicate the decision of when to change generations.

One possible solution to this problem would be to design an intermediate library (e.g., a 0.14 μm library) to ease the generational transition (e.g., from 0.15 μm to 0.13 μm). A 0.13 μm fabrication facility should provide high yields at 0.14 μm, even when the 0.13 μm capability is first introduced. However, this approach is unattractive, since any designs made with such a 0.14 μm library would have to be completely redone once the fabrication technology improves to the point where 0.13 μm designs have sufficient yield. Such intra-generational redesign is highly undesirable, since it adds cost and complexity to the design process.

The requirement for expensive intra-generational redesign follows from the usual assumptions of cell library design, especially the assumption of minimal cell area subject to other constraints. Thus alternative approaches to cell library design (i.e., some kind of scalable library) can be considered to help alleviate this problem. Scalable library approaches considered in the art do not provide a sufficient solution to the intra-generational redesign problem identified above. Many known scalable libraries (e.g., as considered in U.S. Pat. No. 5,598,347, U.S. Pat. No. 5,619,420, U.S. Pat. No. 5,663,662, U.S. Pat. No. 6,336,207, and U.S. Pat. No. 6,467,068) are concerned with providing cells having a scalable drive strength (typically by scaling transistor width). Since drive strength has no relation to the design rule distance, such scaling has no bearing on intra-generational redesign.

Another known cell library design approach that makes use of scalable cells is based on first obtaining a circuit layout using automatic design with standard cells, then automatically optimizing the layout by modifying cells. Typically only the critical paths in the layout are thus optimized, and modifying the standard cells can include scaling them. Such approaches are considered in U.S. Pat. No. 5,872,717 and U.S. Pat. No. 5,880,967. Such approaches are generally contemplated in relation to fixed design rules, especially since it would make little sense to have different design rules for the standard cells and for the modified standard cells. Thus this kind of library scaling also does not address the intra-generational redesign problem.

Known cell libraries also include cell libraries having two (or more) cells corresponding to the same circuit function (or cell type as indicated above), where the cells have different transistor channel lengths (or gate lengths). Transistors with shorter channels tend to have increased speed, but also have increased leakage current. Transistors with longer channels tend to have reduced speed and reduced leakage current. Threshold voltage also tends to decrease with channel length. Provision of cells having varying channel length in the same library allows automatic standard cell library design tools to effectively include such tradeoffs between speed, leakage and threshold voltage in design. Examples of such approaches include U.S. Pat. No. 6,427,226 and U.S. Pat. No. 6,769,110. However, these approaches also do not address the problem of intra-generational redesign.

Accordingly, it is an object of the invention to provide a scalable standard cell library to reduce intra-generational redesign.

SUMMARY

The present invention provides a standard cell library having a globally scalable transistor channel length. In this library, the channel length of every transistor within a cell can be globally scaled, within a predetermined range, without changing cell functionality, cell size, or cell terminal positions. Such a cell library advantageously addresses the above-identified intra-generational redesign problem, since cell channel lengths in library cells can be decreased as fabrication technology evolves within a generation, without requiring intra-generational redesign of existing circuit layouts. Preferably, this change in channel length is obtained by altering a single mask layer of the library design (e.g., the mask for the polysilicon layer).

DETAILED DESCRIPTION

Figure 1:
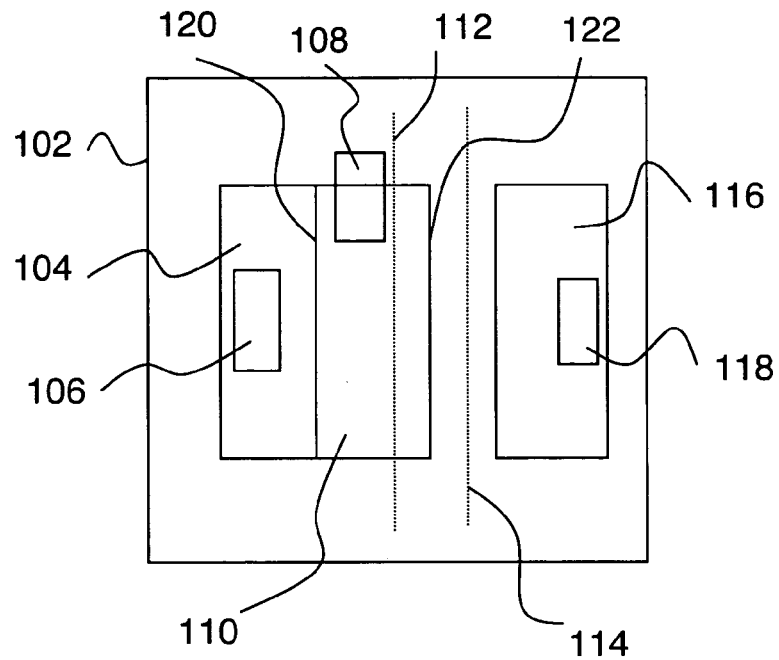
FIG. 1 shows a cell of a standard cell library in accordance with an embodiment of the invention.

FIG. 1 shows a cell of a standard cell library in accordance with an embodiment of the invention. In this example, a cell 102 includes a transistor having a source 104, a gate 110 and a drain 116. Source 104 has a source terminal 106. Similarly, gate 110 and drain 116 have corresponding gate and drain terminals 108 and 118. Gate 110 has boundaries 120 and 122. The distance between boundaries 120 and 122 is the channel length $L_c$ (or gate length). In the example of FIG. 1, boundary 122 can be selected to lie anywhere in a range between line 112 and line 114 without violating design rules. Thus the cell shown on FIG. 1 has a scalable channel length $L_c$, where $L_c$ can be selected within a range $L_1 \leq L_c \leq L_2$. Here $L_1$ is the distance between boundary 120 and line 112, and $L_2$ is the distance between boundary 120 and line 114. For example, FIG. 2a shows a cell having channel length $L_1$ and FIG. 2b shows a cell having channel length $L_2$.

Figure 2A:
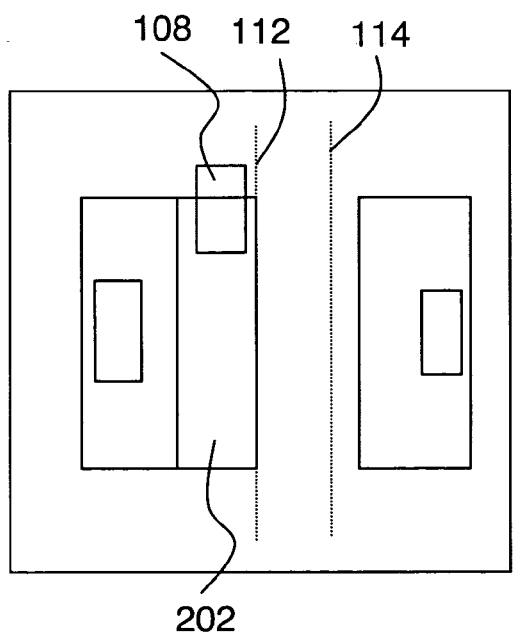
FIGS. 2a and 2b show exemplary variants of the cell of FIG. 1.
Figure 2B:
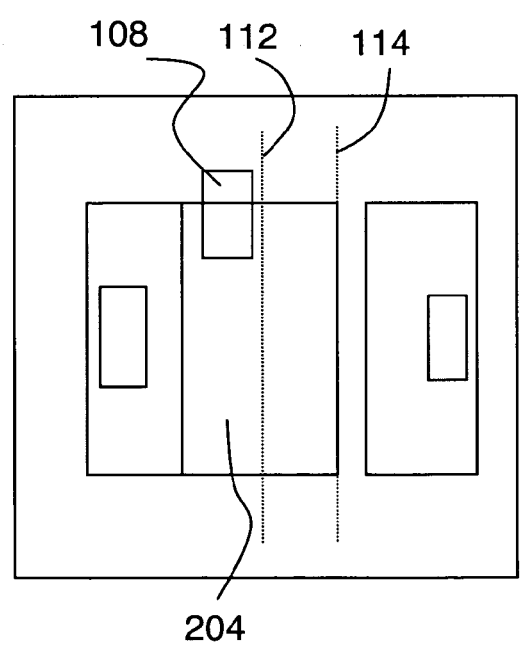

Although only a single transistor is shown in FIGS. 1 and 2a–b, the channel length scaling of the invention is performed on all transistors within a cell. Preferably, all of the cells in a library are scaled according to a common channel length parameter (i.e., $L_c$). Thus the channel length scaling of the invention is preferably a global scaling of all channel lengths in all cells of the library.

As shown on FIGS. 1 and 2a–b, the terminal locations (i.e., the positions of terminals 106, 108, and 118) are not affected by the choice of channel length $L_c$, as long as it is within the range $L_1 \leq L_c \leq L_2$. The physical size of the cell is also unaffected by the choice of channel length within the range $L_1 \leq L_c \leq L_2$. This invariance of terminal positions and cell size is a key feature of the invention, since it ensures that a detailed circuit design layout (e.g., including positions and layout of all cells and of all connections between cells) is unaffected by global changes of transistor channel length within the cells of the circuit design. Thus a circuit design layout using cells having a particular channel length can be reused without redesign when the channel length in the cells is globally changed to a different value. In this manner, channel lengths for all transistors in a circuit designed with library cells can be changed without requiring redesign (i.e., intra-generational redesign is eliminated).

Cells according to the invention tend to have non-minimal area. For example, a conventional minimal area cell having the transistor of FIG. 2a would be smaller than the cell of FIG. 2a, because the separation between gate and drain on FIG. 2a can be decreased without violating design rules. By relaxing the conventional minimal cell area constraint, the above-identified advantage of eliminating intra-generational redesign is realized. Although the difference $L_2-L_1$ can take on any value, preferably it is relatively small (e.g., about 5 nm or about 10 nm), such that the departure from the conventional minimal area condition remains relatively small. For example, if $L_1$ is 0.13 μm and $L_2$ is 0.14 μm, cells having $L_c$ near $L_1$ do not require an unreasonable amount of "wasted area". On the other hand, if $L_1$ were 0.1 μm and $L_2$ were 1.0 μm, then the amount of "wasted area" for $L_c$ near $L_1$ would likely be too large. Thus, the present invention is primarily intended to reduce intra-generational redesign.

Figure 3A:
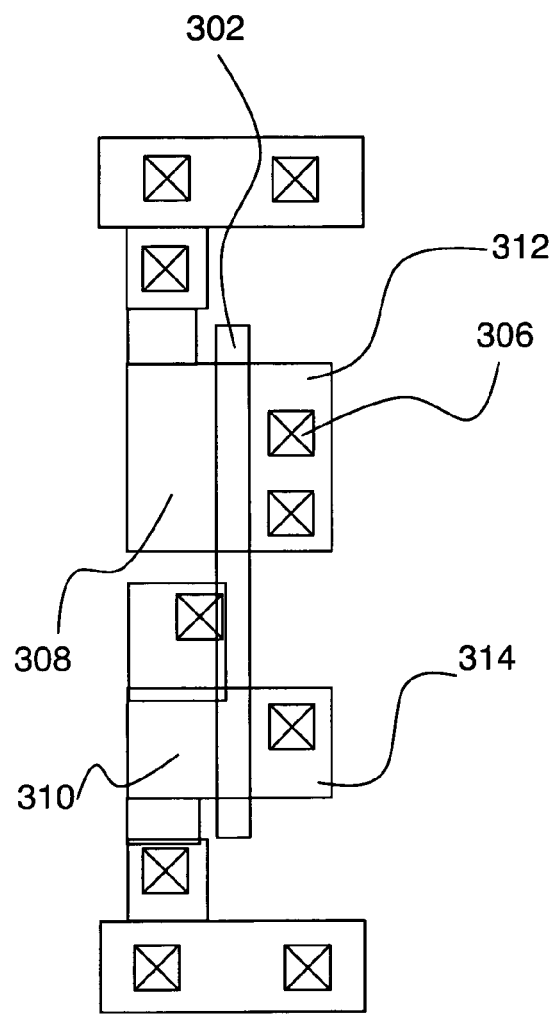
FIGS. 3a and 3b show another example of standard library cells according to an embodiment of the invention.
Figure 3B:
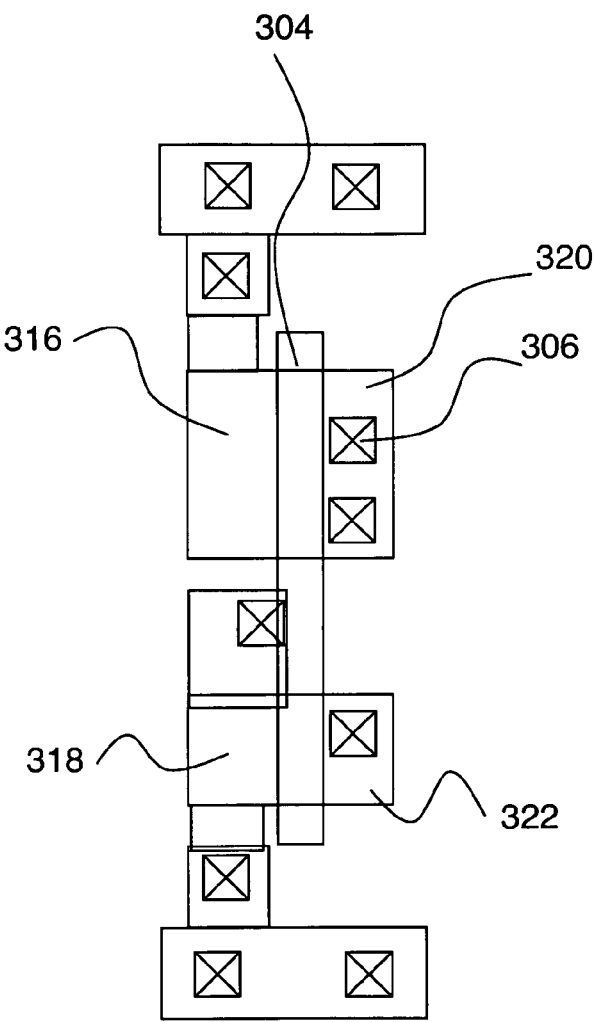

FIGS. 3a–b show a more realistic example of library cells according to an embodiment of the invention. The cells of FIGS. 3a and 3b are inverters and have the same cell size. The positions of all cell terminals (e.g., terminals 306) is also the same for both cells. The cells of FIGS. 3a–b each have two transistors. In the cell of FIG. 3a, a first transistor has a source 308 and a drain 312 and a second transistor has a source 310 and a drain 314. Stripe 302 defines the channel length (or gate length) for both transistors. In the cell of FIG. 3b, a first transistor has a source 316 and a drain 320 and a second transistor has a source 318 and a drain 322. Stripe 304 defines the channel length (or gate length) for both transistors.

Figure 4:
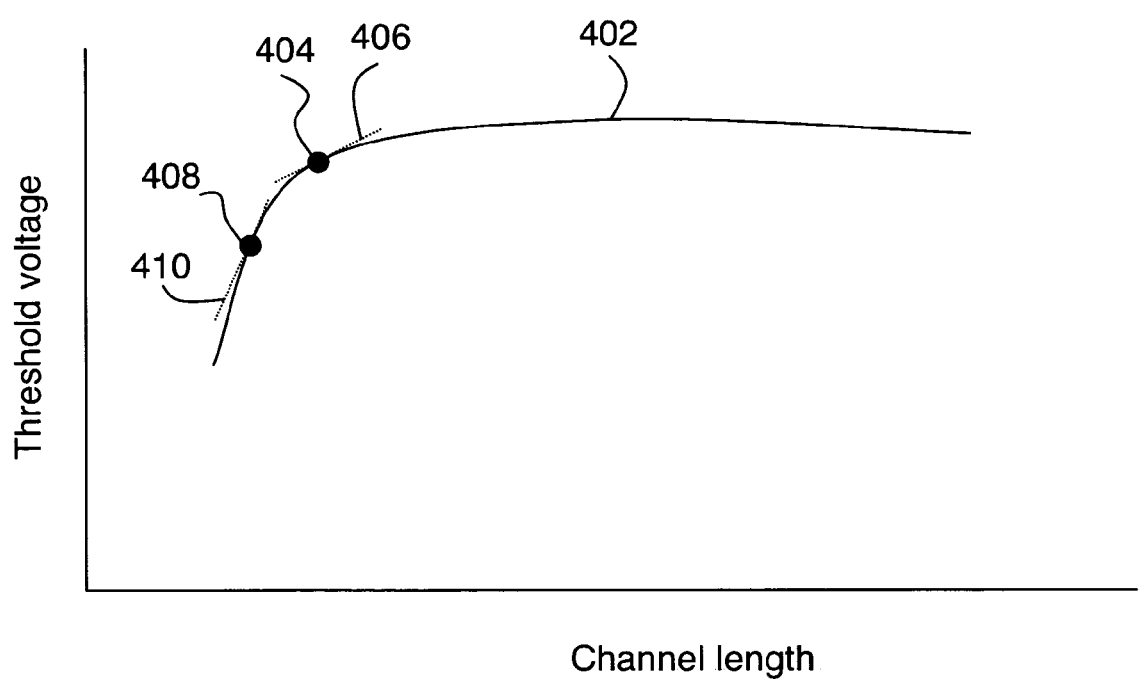
FIG. 4 schematically shows threshold voltage vs. channel length for a typical transistor.

The difference between the two cells is that stripe 302 defines a channel length of 0.13 μm and stripe 304 defines a channel length of 0.14 μm. Such a change in cell layout is preferably accomplished by varying a single mask layer, such as the mask layer defining polycrystalline silicon (poly-silicon) gate features. Scaling by changing only a single mask layer is much less costly than scaling by changing multiple mask layers Further advantages of the present invention can be appreciated with reference to FIG. 4. Transistor threshold voltage vs. channel length typically has the shape shown by curve 402 on FIG. 4, where two design points 404 and 408 can have significantly different properties depending on their location on curve 402. More specifically, points 404 and 408 have corresponding sensitivities of threshold voltage to variation in channel length. These sensitivities for points 404 and 408 are graphically represented by the slopes of lines 406 and 410 respectively. Point 408, having a reduced channel length, has a significantly higher sensitivity to variations in channel length than point 406.

In many cases of practical interest, the channel length corresponding to point 408 is comparable to the minimal feature size provided by a fabrication facility. Furthermore, it is usually the case that a fabrication facility will tend to provide more controlled processes (e.g., having reduced channel length statistical scatter) as incremental improvements are made to the processing methods. Thus the design flexibility provided by cell libraries of the present invention can be used to design for improved yield more effectively. For example, suppose a fabrication vendor announces plans to offer a 0.13 μm capability at a certain date. A circuit designer can construct a library according to the invention having channel lengths scalable from 0.13 μm to 0.14 μm. Design rules in this example are preferably 0.14 μm for channel features and 0.13 μm for non-channel features. Generally, yield will improve as the channel length increases, and most aspects of device performance will improve as channel length decreases. The use of larger design rules for channel features also improves yield.

With such a library, the circuit designer can flexibly trade off performance with yield without altering any other aspect of the circuit designs. Such design flexibility is especially valuable in view of the high likelihood that the fabrication facility will provide improved performance over time (in a manner that is difficult to forecast in detail). To exploit such unpredictable improvements, the circuit designer in this example can reduce the global library channel length as the fabrication capability improves. In this example, it is likely that the library scaling would initially correspond to a channel length close to point 404. As fabrication capability improves, the library channel length scaling would move closer to point 408. Thus many of the benefits of reduced channel length are obtained without incurring a costly intra-generational redesign.

Low-leakage design provides an example of such considerations. Leakage is a sensitive function of channel length, and tends to increase as channel length decreases. For example, the leakage for a transistor having a 0.13 μm channel length can be twice the leakage of a similar transistor having a 0.14 μm channel length. Thus fabrication variance of the channel length can significantly affect yield of low-leakage designs. According to the invention, the library channel length can be adjusted over time to match low-leakage designs made with the library to evolving fabrication capability. Such flexibility is a significant advantage of the invention.

Two (or more) types of transistors can be included in library cells. For example, a cell library can include both high-threshold (HVT) and low-threshold (LVT) transistors. HVT transistors are often used in low-leakage design, since their leakage tends to be much lower (e.g., about a factor 5 lower) than LVT transistor leakage. Since HVT and LVT transistors both have the significant sensitivity of leakage to channel length variation discussed above, practice of the invention is also advantageous in such cases. Thus a cell library having a globally scalable channel length and including two (or more) types of transistor having differing threshold voltage is another embodiment of the invention.

Embodiments of the invention have been described above by way of example without thereby limiting the invention. In particular, the various numerical cases considered above are such examples. In broad terms, the scalable library of the present invention provides a general approach for following the evolution of fabrication technology in circuit design with reduced design cost. This capability is expected to be particularly valuable as fabrication technology evolves to provide feature sizes less than 0.1 μm.

A cell library according to the present invention can be physically embodied in any information bearing medium. Preferably, a cell library of the present invention is embodied in (i.e., provided by) a computer-readable medium (e.g., magnetic disk or tape, optical disk, etc.), to facilitate use of the library in an automatic circuit design tool.

What is claimed is:

1. A method for circuit design, the method comprising:
  a) providing a globally scalable standard cell library including a plurality of cell types, each cell type providing a corresponding circuit function, and each cell type having one or more corresponding cells;
    wherein a global channel length $L_c$ is substantially equal to the channel length of every transistor in each of said cells, and wherein $L_c$ is within a predetermined range $L_1 \leq L_c \leq L_2$;
    wherein each of said cells has a physical cell size and cell terminal locations which do not depend on said global channel length $L_c$;
  b) selecting said global channel length $L_c$;
  c) performing automatic circuit design by selecting cells from said cell library to provide a circuit design, wherein each of said selected cells has transistors with said selected channel length $L_c$;
    wherein said circuit design has a layout including said physical cell sizes and said cell terminal locations that is substantially independent of $L_c$, thereby providing the ability to vary $L_c$ in said circuit design without altering said layout.

2. The method of claim 1, wherein $L_2 - L_1$ is about 10 nm.

3. The method of claim 1, wherein $L_2 - L_1$ is about 5 nm.

4. The method of claim 1, wherein some of said cells include a first transistor type and others of said cells include a second transistor type, wherein said second transistor type has a higher threshold voltage than said first transistor type.

5. The method of claim 1, wherein said global channel length parameter $L_c$ is selectable by altering a single mask layer.

6. The method of claim 5, wherein said single mask layer is a mask layer for defining gate poly-silicon features.

7. The method of claim 1, wherein $L_1$ is substantially equal to a minimum feature size provided by an integrated circuit fabrication facility.

8. The method of claim 1, wherein said globally scalable standard cell library is provided by a computer readable medium.

* * * * *